US006995066B2

(12) United States Patent
Shim

(10) Patent No.: US 6,995,066 B2
(45) Date of Patent: Feb. 7, 2006

(54) METHOD OF FABRICATING SEMICONDUCTOR DEVICE BY USING SACRIFICE LAYER FOR FORMING DIFFUSION REGIONS

(75) Inventor: Hee Sung Shim, Seoul (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 11/022,656

(22) Filed: Dec. 28, 2004

(65) Prior Publication Data

US 2005/0142760 A1 Jun. 30, 2005

(30) Foreign Application Priority Data

Dec. 31, 2003 (KR) ............... P 10-2003-0101819

(51) Int. Cl.
*H01L 21/336* (2006.01)

(52) U.S. Cl. ..................... 438/303; 438/595

(58) Field of Classification Search ............. 438/303, 438/595
See application file for complete search history.

(56) References Cited

U.S. PATENT DOCUMENTS 5,573,965 A * 11/1996 Chen et al. ............ 438/297
6,770,540 B2 * 8/2004 Ko ........................ 438/303

* cited by examiner

*Primary Examiner*—Jack Chen
(74) *Attorney, Agent, or Firm*—Finnegan, Henderson, Farabow, Garrett, & Dunner, L.L.P.

(57) ABSTRACT

The present invention provides a method of fabricating a semiconductor device, by which leakage current is minimized and by which drivability of transistor is sustained. The present invention includes forming a gate pattern having a gate oxide layer underneath on a semiconductor substrate, forming a first oxide layer on the substrate including the gate pattern, forming lightly doped regions in the semiconductor substrate to be aligned with the gate pattern, forming a second oxide layer on the first oxide layer, forming a spacer on the second oxide layer over a sidewall of the gate pattern, forming a sacrifice layer over the substrate including the spacer, forming source and drain regions in the substrate to be aligned with the gate pattern and to be partially overlapped with the lightly doped regions, respectively, and removing the sacrifice insulating layer and portions of the first and second oxide layers failing to be covered with the spacer.

5 Claims, 3 Drawing Sheets

METHOD OF FABRICATING SEMICONDUCTOR DEVICE BY USING SACRIFICE LAYER FOR FORMING DIFFUSION REGIONS

This application claims the benefit of the Korean Application No. P2003-0101819 filed on Dec. 31, 2003, which is hereby incorporated by reference.

BACKGROUND OF THE INVENTION

1. Field of the Invention

The present invention relates to a method of fabricating a semiconductor device, and more particularly, to a method of fabricating a transistor in a semiconductor device.

2. Discussion of the Related Art

Generally, the higher the degree of integration of a semiconductor device abruptly rises, the thinner a gate oxide layer between a substrate and gate. An electric field between a gate and source/drain junction is raised to generate gate induced drain leakage (GIDL) current The leakage current is induced by the strong electric field appearing between the gate and drain. In order to reduce the leakage current, many methods have been proposed. For instance, a thickness of a gate oxide layer or an oxide layer on a gate sidewall is increased, or a width of a spacer of a gate is increased.

However, drivability of a transistor is lowered in case of increasing the thickness of the oxide layer on the gate sidewall. In case of increasing the width of the spacer, an area of silicide formed in source and drain regions is reduced. Hence, resistance increases and a process margin of a via contact for connecting the source or drain region to an external device is lowered.

SUMMARY OF THE INVENTION

Accordingly, the present invention is directed to a method of fabricating a semiconductor device that substantially obviates one or more problems due to limitations and disadvantages of the related art.

An object of the present invention is to provide a method of fabricating a semiconductor device, by which leakage current is minimized and by which drivability of transistor is sustained.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a semiconductor device according to the present invention includes the steps of forming a gate pattern having a gate oxide layer underneath on a semiconductor substrate, forming a first oxide layer on the substrate including the gate pattern, forming lightly doped regions in the semiconductor substrate to be aligned with the gate pattern, forming a second oxide layer on the first oxide layer, forming a spacer on the second oxide layer over a sidewall of the gate pattern, forming a sacrifice layer over the substrate including the spacer, forming source and drain regions in the substrate to be aligned with the gate pattern and to be partially overlapped with the lightly doped regions, respectively, and removing the sacrifice insulating layer and portions of the first and second oxide layers failing to be covered with the spacer.

Preferably, the method further includes the step of forming a silicide layer on the source and drain regions and a topside of the gate pattern.

Preferably, the sacrifice layer is formed of a material having high etch selectivity from the spacer.

More preferably, the sacrifice insulating layer is formed of TEOS.

Preferably, the lightly doped regions are formed by first ion implantation using the gate pattern as a first ion implantation mask.

Preferably, the source and drain regions are formed by second ion implantation using the gate pattern, the first oxide layer, the second oxide layer, and the spacer, and the sacrifice layer as a second ion implantation mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
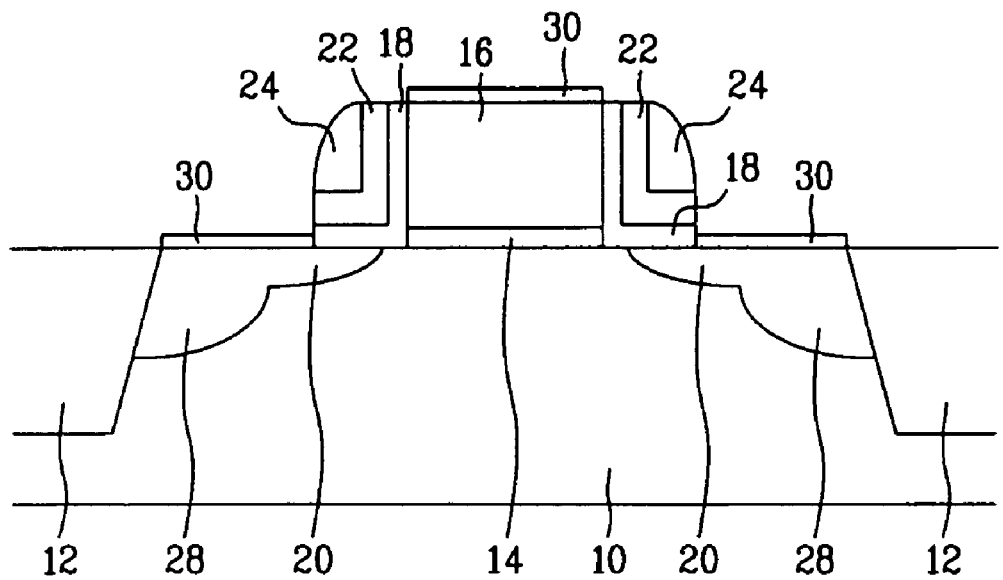
FIG. 1 is a cross-sectional diagram of a semiconductor device according to the present invention.

FIG. 1 is a cross-sectional diagram of a semiconductor device according to the present invention.

Referring to FIG. 1, source and drain regions 28 are formed in an active area of a semiconductor substrate 10 defined by a device isolation area. And, a channel region is provided between the source and drain regions 28. The source and drain regions 28 are heavily doped with impurity ions. And, the channel region is an intrinsic semiconductor region that can be doped with threshold voltage (Vth) adjustment ions.

A gate oxide layer 14 is formed on the semiconductor substrate 10 corresponding to the channel region.

A gate 16 having a first buffer layer 18, second buffer layer 22, and spacer 24 is formed on the gate oxide layer 14. The second buffer layer 22 is stacked on the first buffer layer 18. Each vertical cross-section of the first and second buffer layers 18 and 22 has an L-shape including a vertical portion and a horizontal portion. Hence, the vertical portion of the first buffer layer 18 is formed on sidewalls of the gate 16 and the gate oxide layer 14, while the horizontal portion of the first buffer layer 18 extends from a lower end of the vertical portion toward the source or drain region 28. And, the spacer 24 is formed on the second buffer layer 22.

Specifically, the source/drain region 28 leaves a prescribed distance from the spacer 24, and a lightly doped region 20 is horizontally formed in the semiconductor substrate 10 between the spacer 10 and the source/drain region 28.

And, a silicide layer 30 is formed on a topside of the gate 16 and the source and drain regions 28.

Hence, in the above-configured semiconductor device according to the embodiment of the present invention, a sufficient area of the silicide layer 30 is secured and the prescribed distance is left between the gate 16 and the source/drain region 28 due to the first and second buffer layers 18 and 22 and the spacer 24, whereby the gate induced drain leakage current can be minimized.

FIGS. 2 to 5 are cross-sectional diagrams for explaining a method of fabricating a semiconductor device according to an embodiment of the present invention.

Figure 2:
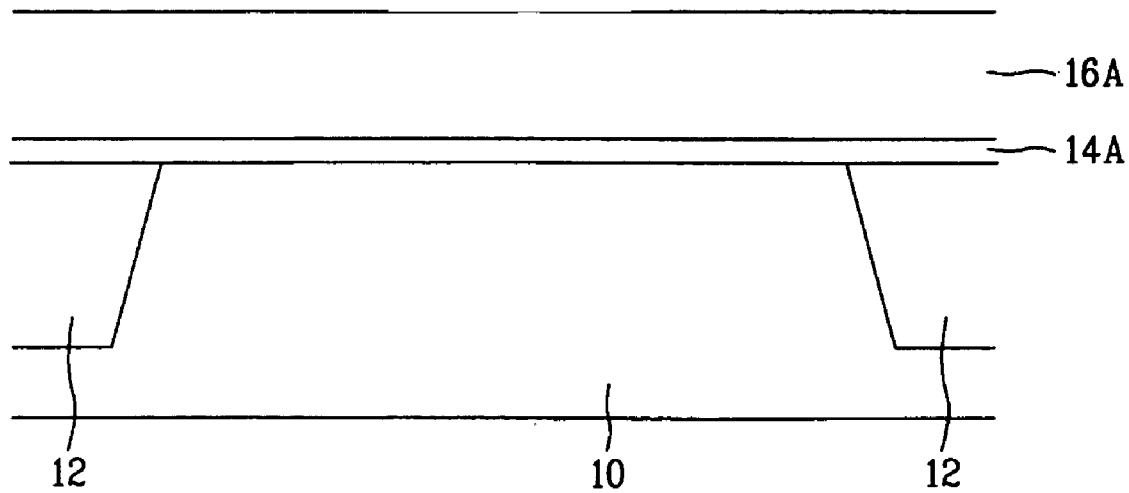
FIGS. 2 to 5 are cross-sectional diagrams for explaining a method of fabricating a semiconductor device according to an embodiment of the present invention.

Referring to FIG. 2, a device isolation layer 12 is formed in a semiconductor substrate 10 to define a device isolation area and an active area.

A pad oxide layer 14A is formed on the semiconductor substrate 10 by thermal oxidation. The pad oxide layer 14A, which is a buffer layer protecting the substrate 10 against ion implantation, is formed to have a minimum thickness so as not to be broken by a prescribed voltage.

And, polysilicon is deposited on the pad oxide layer 14A to form a polysilicon layer 16A.

Figure 3:
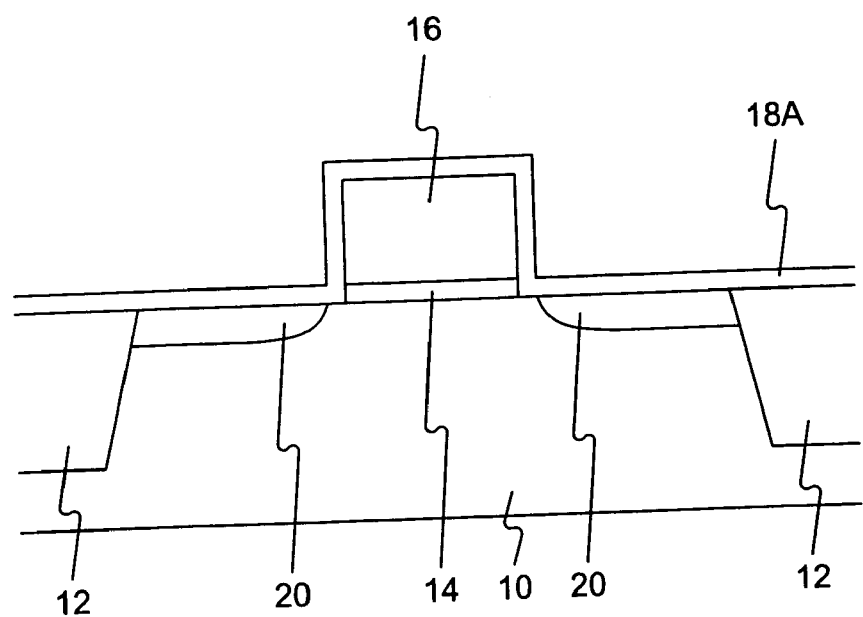

Referring to FIG. 3, a gate 16 and a gate oxide layer 14 are formed by patterning the polysilicon layer 16A and the pad oxide layer 14A by photolithography.

A first oxide layer 18A is formed on the substrate 10 including the gate 10 to cover the active area. In doing so, the first oxide layer 18A is formed by thermal oxidation or chemical vapor deposition.

Ion implantation is lightly carried out on the substrate 10 using the gate 16 as an ion implantation mask, thereby forming lightly doped regions 20. In doing so, a p type dopant includes B, Ga, and the like and an n type dopant includes P, As, and the like.

Figure 4:
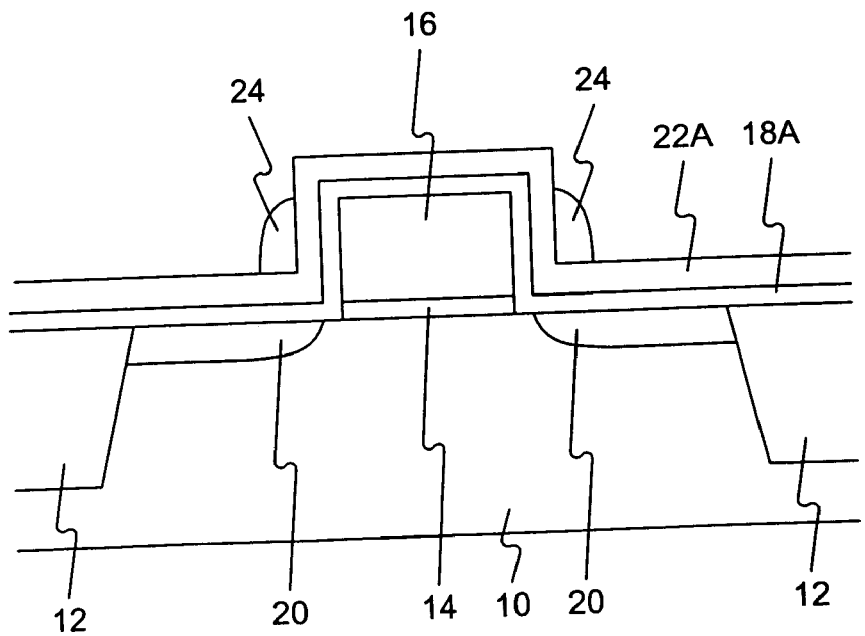

Referring to FIG. 4, a second oxide layer 22A and a nitride layer are stacked on the first oxide layer 18A. In doing so, the second oxide layer 22A is formed by depositing TEOS by CVD.

And, the nitride layer is etched by blank etch or etch-back to remain on a sidewall of the second oxide layer 22A as a spacer 24.

Figure 5:
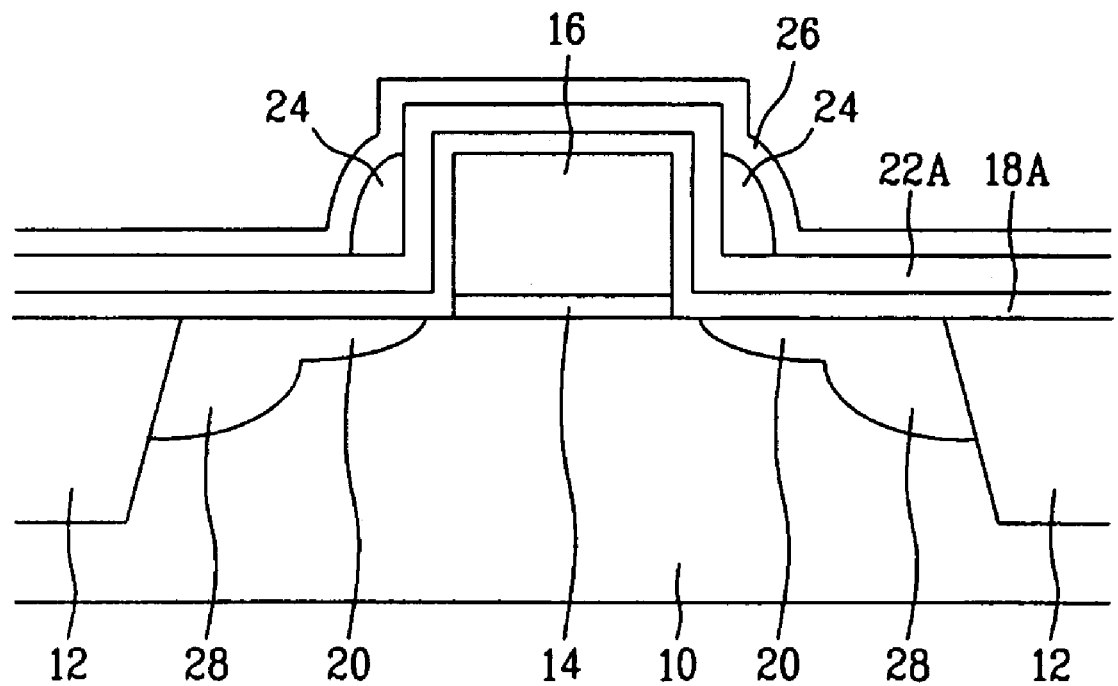

Referring to FIG. 5, a sacrifice insulating layer is formed over the substrate 10 including the spacer 24. The sacrifice 26 is formed of a material having high etch selectivity from the spacer 24. For instance, the sacrifice insulating layer 26 is preferably formed of TEOS used for the second oxide layer 22A or the like.

Heavy ion implantation is carried out on the semiconductor substrate 10 in the active area to form source and drain regions 28 aligned with the gate. In doing so, the distance between the spacer 24 and the source/drain region 28 depends on a thickness of the sacrifice insulating layer 26.

By adjusting the thickness of the sacrifice insulating layer 26 according to the gate induced drain leakage current, the distance between the gate 16 and the source/drain region 28, whereby the leakage current can be minimized.

Subsequently, the sacrifice layer 26, as shown in FIG. 1, is removed by wet or dry etch. In doing so, portions of the first and second oxide layers 18A and 22A failing to be covered with the spacer 24 are removed to form the first and second buffer layers 18 and 22 in FIG. 1.

Silicidation is carried out on the substrate 10 to form a metal layer to form a silicide layer 30. In doing so, an area of the silicide layer 30 formed on the active area is not reduced since the thickness of the first buffer layer 18, second buffer layer 22, or spacer 24 provided to the sidewall of the gate 16 is sustained.

Hence, a process margin for forming a via contact for connecting the source/drain region 28 to an external device is not lowered and the prescribed distance is sustained between the gate 16 and the source/drain region 28, whereby the leakage current can be minimized in-between.

Accordingly, the present invention facilitates to adjust the distance between the gate and the source/drain region using the sacrifice insulating layer, thereby reducing the leakage current.

Therefore, the present invention enhances reliability of the device and provides the high quality of device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising the steps of:
    forming a gate pattern having a gate oxide layer underneath on a semiconductor substrate;
    forming a first oxide layer on the substrate including the gate pattern;
    forming lightly doped regions in the semiconductor substrate to be aligned with the gate pattern;
    forming a second oxide layer on the first oxide layer;
    forming a spacer on the second oxide layer over a sidewall of the gate pattern;
    forming a sacrifice layer over the substrate including the spacer;
    forming source and drain regions in the substrate by ion implantation using the gate pattern, the first oxide layer, the second oxide layer, and the spacer, and the sacrifice layer as an ion implantation mask, the source and drain regions to be aligned with the gate pattern and to be partially overlapped with the lightly doped regions, respectively; and
    removing the sacrifice layer and portions of the first and second oxide layers not covered with the spacer.

2. The method of claim 1, further comprising the step of forming a silicide layer on the source and drain regions and a topside of the gate pattern.

3. The method of claim 1, wherein the sacrifice layer is formed of a material having high etch selectivity from the spacer.

4. The method of claim 3, wherein the sacrifice layer is formed of TEOS.

5. The method of claim 1, wherein the lightly doped regions are formed by ion implantation using the gate pattern as an ion implantation mask.

* * * * *